(12) United States Patent
Peng (10) Patent No.: US 8,501,579 B2
(45) Date of Patent: Aug. 6, 2013

(54) PROCESS OF FABRICATING CHIP

(75) Inventor: Sheng-Yang Peng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 664 days.

(21) Appl. No.: 12/703,488

(22) Filed: Feb. 10, 2010

(65) Prior Publication Data

US 2010/0230788 A1  Sep. 16, 2010

(30) Foreign Application Priority Data

Mar. 10, 2009 (TW) ................................ 98107682 A (51) Int. Cl.
*H01L 21/76* (2006.01)

(52) U.S. Cl.
USPC ....... 438/424; 438/459; 438/691; 257/E29.02

(58) Field of Classification Search
USPC ................ 438/390–393, 424, 427, 459, 464, 438/690–691; 257/E29.02
See application file for complete search history.

(56) References Cited

U.S. PATENT DOCUMENTS

2004/0192029 A1* 9/2004 Hartwell ......................... 438/637
2007/0069364 A1* 3/2007 Kawano et al. ............... 257/698

FOREIGN PATENT DOCUMENTS

| CN | 1753169 | 3/2006 |
|----|---------|--------|
| CN | 101236920 | 8/2008 |

OTHER PUBLICATIONS

Chinese First Examination Report of China Application No. 200910130261.4, dated May 4, 2011.

* cited by examiner

Primary Examiner — H. Jey Tsai
(74) Attorney, Agent, or Firm — J.C. Patents (57) ABSTRACT

A chip structure includes a substrate and a stress buffer layer. The substrate has a first surface and a second surface opposite to the first surface. The stress buffer layer is disposed on the periphery of the substrate and located in at least one of the first surface and the second surface of the substrate.

16 Claims, 7 Drawing Sheets

PROCESS OF FABRICATING CHIP

CROSS-REFERENCE TO RELATED APPLICATION

This application claims the priority benefit of Taiwan application serial no. 98107682, filed on Mar. 10, 2009. The entirety of the above-mentioned patent application is hereby incorporated by reference herein and made a part of this specification.

BACKGROUND OF THE INVENTION

1. Field of the Invention

The present application relates to a semiconductor structure and a process of fabricating a semiconductor. More particularly, the present application relates to a chip structure, a wafer structure, and a process of fabricating a chip.

2. Description of Related Art

Prior to implementation of a cutting process, a thinning process is often performed on a wafer formed by carrying out a semiconductor integrated circuit fabricating process, such that a thickness of the wafer is reduced. After the thinning process is performed on the wafer, a ratio of the area to the thickness of the wafer is increased. Therefore, during subsequent processes of picking up and placing the wafer, transporting the wafer by using a machine, and cutting the wafer, the wafer is apt to be cracked. As a result, it is necessary for the thinned wafer to be adhered to and supported by a holder, which is conducive to the subsequent processes. Nonetheless, the wafer should still be removed from the holder after the cutting process is performed, and chip cracks are also prone to occur during and after removal of the wafer from the holder.

SUMMARY OF THE INVENTION

The present application is directed to a chip structure having a stress buffer layer.

The present application is further directed to a wafer structure having a stress buffer layer. The stress buffer layer acts as a supporting structure of a thinned substrate and is capable of preventing a wafer from being cracked or precluding cracks from extending during implementation of a cutting process.

The present application is further directed to a process of fabricating a chip. By performing the process, chip units having both conductive through holes and stress buffer rings can be formed.

In the present application, a chip structure having a substrate and a stress buffer layer is provided. The substrate has a first surface and a second surface opposite to the first surface. The stress buffer layer is disposed on the periphery of the substrate and located in at least one of the first surface and the second surface of the substrate.

In the present application, a wafer structure having a substrate and a stress buffer layer is further provided. The substrate has a first surface, a second surface opposite to the first surface, and a plurality of cutting paths dividing the substrate into a plurality of chip units. The stress buffer layer surrounds each of the chip units and is disposed on at least one of the first surface and the second surface of the substrate.

In the present application, a process of fabricating a chip is further provided. In the process, first, a wafer is provided. The wafer has a first surface and a second surface opposite to each other. A plurality of blind holes is then formed on the first surface of the wafer. Next, an insulating layer and an electroplating seed layer are formed on the first surface and on walls of the blind holes. Here, the electroplating seed layer covers the insulating layer. Thereafter, a patterned mask is formed on the electroplating seed layer located above the first surface. After that, a conductive material is formed in the blind holes by performing an electroplating process so as to form a plurality of conductive blind holes. In addition, a plurality of stress buffer rings are formed on a portion of the electroplating seed layer located above the first surface. Here, the conductive blind holes are respectively located in the stress buffer rings. Finally, the patterned mask and a portion of the electroplating seed layer located below the patterned mask are removed.

In the present application, a process of fabricating a chip is further provided. In the process, first, a wafer is provided. The wafer has a first surface and a second surface opposite to each other. A plurality of holes is then formed on the first surface of the wafer. Thereafter, an electroplating seed layer is formed on the first surface and on walls of the holes. A first patterned mask is formed on the electroplating seed layer located above the first surface. Afterwards, a conductive material is formed in the holes by performing an electroplating process so as to form a plurality of conductive holes. The first patterned mask and a portion of the electroplating seed layer located below the first patterned mask are then removed. A second patterned mask is formed on the first surface of the wafer. Next, the first surface is etched with use of the second patterned mask as an etching mask so as to form a plurality of insulating ring areas and a plurality of stress buffer ring areas. Here, the insulating ring areas respectively expose side walls of the conductive holes, and the insulating ring areas are respectively located in the stress buffer ring areas. Finally, an insulating material is disposed in the insulating ring areas and the stress buffer ring areas to form a plurality of insulating rings and a plurality of stress buffer rings.

Based on the above, the wafer structure of the present application is equipped with a stress buffer layer. Therefore, after a thinning process is carried out, the stress buffer layer not only can serve as a supporting structure for preventing the wafer structure from being cracked when the thinned wafer structure is picked up, placed, and transported by a machine, but also can preclude the wafer from being cracked or preclude cracks from extending to chip areas located at respective sides of adjacent cutting paths when the wafer structure is cut and divided into a plurality of chip structures. As such, cutting yield can be improved.

In order to make the aforementioned and other features and advantages of the present application more comprehensible, several embodiments accompanying figures are described in detail below.

BRIEF DESCRIPTION OF THE DRAWINGS

The accompanying drawings are included to provide a further understanding of the application and incorporated in and constitute a part of this specification. The drawings illustrate embodiments of the invention and, together with the description, serve to explain the principles of the invention.

DESCRIPTION OF EMBODIMENTS

Figure 1A:
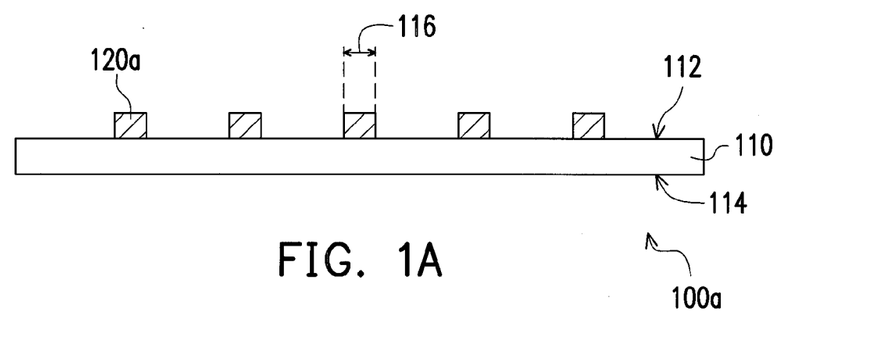
FIG. 1A is a schematic cross-sectional view of a wafer structure according to an embodiment of the present invention.
Figure 1B:
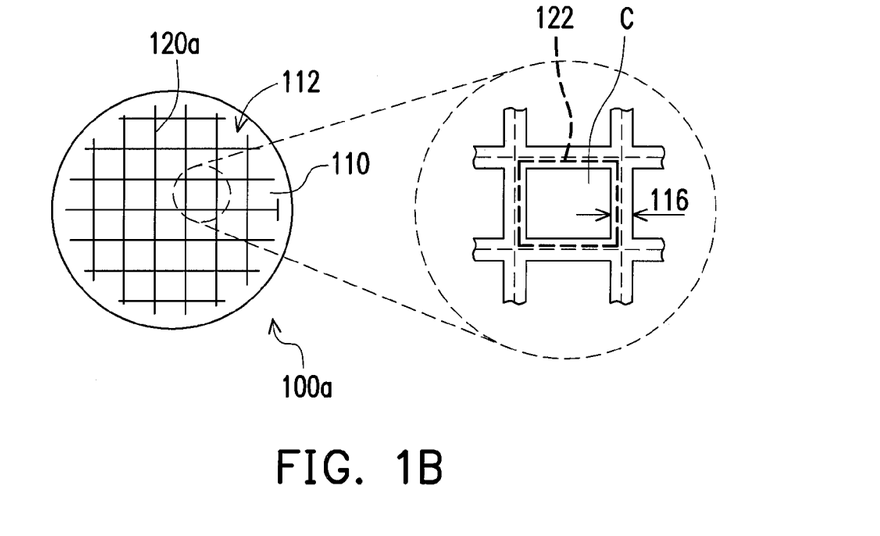
FIG. 1B contains a schematic top view and a schematic partially-enlarged view of the wafer structure depicted in FIG. 1A.
Figure 1C:
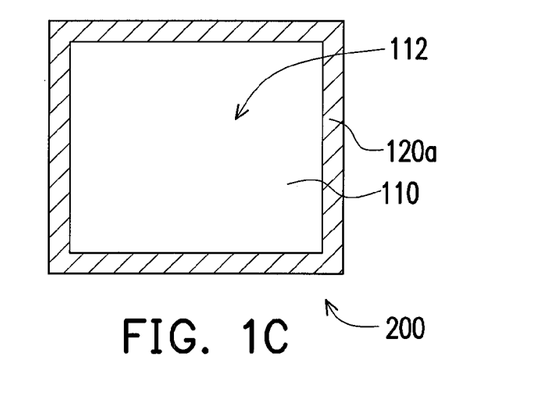
FIG. 1C is a schematic top view illustrating a chip structure which is formed by cutting the wafer structure depicted in FIG. 1A.

FIG. 1A is a schematic cross-sectional view of a wafer structure according to an embodiment of the present invention. FIG. 1B contains a schematic top view and a schematic partially-enlarged view of the wafer structure depicted in FIG. 1A. FIG. 1C is a schematic top view illustrating a chip structure which is formed by cutting the wafer structure depicted in FIG. 1A. Referring to FIGS. 1A and 1B, in the present embodiment, a wafer structure 100a includes a substrate 110 and a stress buffer layer 120a.

In detail, the substrate 110 has a first surface 112, a second surface 114 opposite to the first surface 112, and a plurality of cutting paths 116 dividing the substrate 110 into a plurality of chip units C. Here, the cutting paths 116 are defined by an area of the first surface 112 of the substrate 110 which is not covered by a passivation layer (not shown), and said area does not include pad regions (not shown) exposed by the passivation layer.

The stress buffer layer 120a is disposed on the cutting paths 116 and surrounds each of the chip units C. Here, the stress buffer layer 120a is located in at least one of the first surface 112 and the second surface 114 of the substrate 110. Specifically, in the present embodiment, the stress buffer layer 120a protrudes from the first surface 112 of the substrate 110, and the stress buffer layer 120a is a lattice-like pattern formed by stress buffer rings 122 connected to one another. Here, the stress buffer rings 122 are integrally formed, and a first surface 112 of the substrate 110 is an active surface. A material of the stress buffer layer 120a includes metal, glass, or a polymer material, and the metal discussed herein is copper preferably.

Certainly, in other embodiments which are not illustrated in the drawings, the stress buffer layer 120a can also be formed by individual stress buffer rings 122 respectively surrounding the chip units C. Therefore, the stress buffer layer 120a shown in FIGS. 1A and 1B are exemplary and are not to limit the present invention.

The wafer structure 100a of the present embodiment has the stress buffer layer 120a. Therefore, when a thinning process is performed on the wafer structure 100a to reduce the entire thickness of the wafer structure 100a, the stress buffer layer 120a can serve as a supporting structure for preventing the thinned wafer structure 100a from being cracked when the thinned wafer structure 100a is picked up, placed, and transported by a machine. Besides, referring to FIGS. 1B and 1C, when the wafer structure 100a is cut by a cutting tool (not shown) along the cutting paths 116 and divided into a plurality of chip structures 200, the stress buffer layer 120a can also preclude cracks from extending to the chip units C located at respective sides of the adjacent cutting paths 116. As such, cutting yield can be improved.

In the present embodiment, it should be mentioned that a width of the cutting paths 116 is greater than or equal to a width of the stress buffer layer 120a, while a width of the cutting tool (not shown) is less than the width of the stress buffer layer 120a. That is to say, when the wafer structure 100a is cut by the cutting tool along the cutting paths 116 and divided into the chip structures 200, each of the chip structures 200 includes the stress buffer layer 120a located in the periphery of the substrate 110 of each of the chip structures 200.

Figure 2:
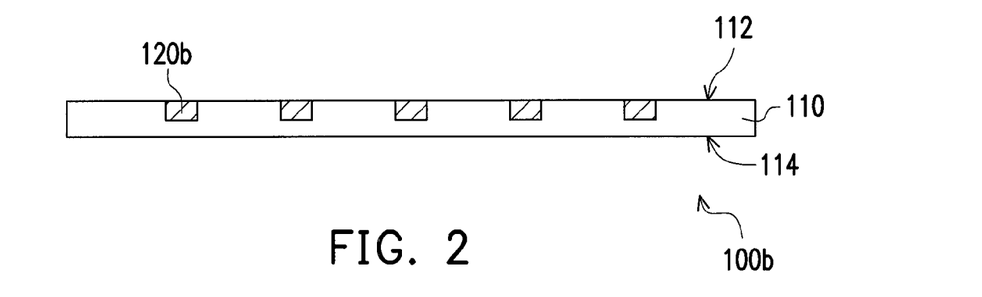
FIG. 2 is a schematic cross-sectional view of a wafer structure according to another embodiment of the present invention.

FIG. 2 is a schematic cross-sectional view of a wafer structure according to yet still another embodiment of the present invention. Referring to FIGS. 1A and 2, a wafer structure 100b depicted in FIG. 2 is similar to the wafer structure 100a depicted in FIG. 1A, while the difference therebetween lies in that a stress buffer layer 120b of the wafer structure 100b depicted in FIG. 2 is embedded in the first surface 112 of the substrate 110.

Figure 3:
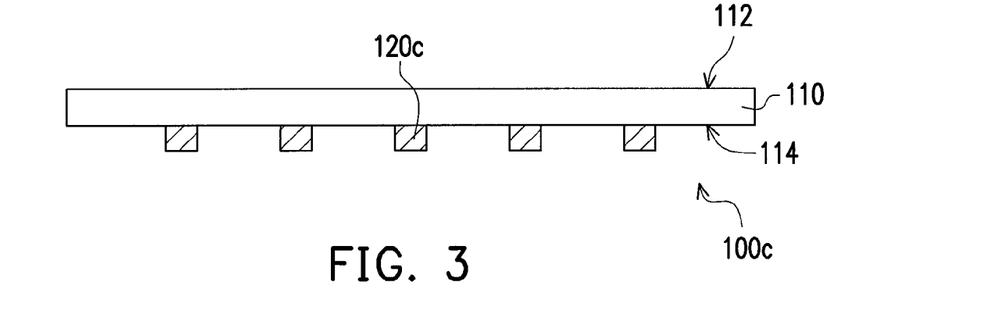
FIG. 3 is a schematic cross-sectional view of a wafer structure according to still another embodiment of the present invention.

FIG. 3 is a schematic cross-sectional view of a wafer structure according to yet still another embodiment of the present invention. Referring to FIGS. 1A and 3, a wafer structure 100c depicted in FIG. 3 is similar to the wafer structure 100a depicted in FIG. 1A, while the difference therebetween lies in that a stress buffer layer 120c of the wafer structure 100c depicted in FIG. 3 protrudes from the second surface 114 of the substrate 110. Here, the second surface 114 is a non-active surface.

Figure 4:
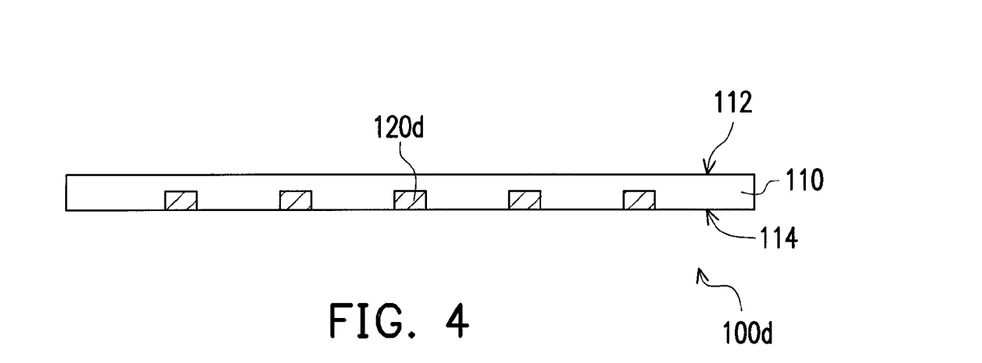
FIG. 4 is a schematic cross-sectional view of a wafer structure according to yet still another embodiment of the present invention.

FIG. 4 is a schematic cross-sectional view of a wafer structure according to yet still another embodiment of the present invention. Referring to FIGS. 1A and 4, a wafer structure 100d depicted in FIG. 4 is similar to the wafer structure 100a depicted in FIG. 1A, while the difference therebetween lies in that a stress buffer layer 120d of the wafer structure 100d depicted in FIG. 4 is embedded in the second surface 114 of the substrate 110. Here, the second surface 114 is a non-active surface.

Figure 5:
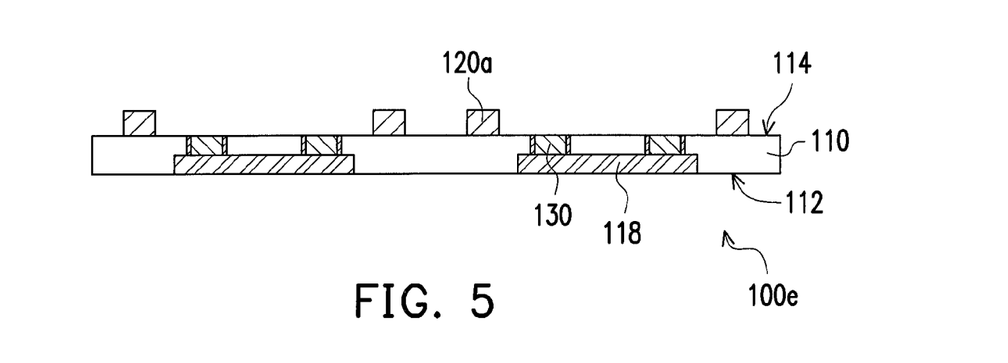
FIG. 5 is a schematic cross-sectional view of a wafer structure according to yet still another embodiment of the present invention.

FIG. 5 is a schematic cross-sectional view of a wafer structure according to yet still another embodiment of the present invention. Referring to FIGS. 1A and 5, a wafer structure 100e depicted in FIG. 5 is similar to the wafer structure 100a depicted in FIG. 1A, while the difference therebetween lies in that the wafer structure 100e depicted in FIG. 5 further includes a plurality of conductive through holes 130, and a plurality of active circuits 118 are located on the first surface 112. The conductive through holes 130 penetrate the second surface 114 of the substrate 110 and connect the active circuits 118. The stress buffer layer 120a is located on an area outside the active circuits 118. Here, the first surface 112 is an active surface, whereas the second surface 114 is a non-active surface. Namely, the wafer structure 100e having active devices is described in the present embodiment.

The wafer structures 100a~100e and the chip structures 200 are described in above embodiments of the present invention, while a process of fabricating a chip is not discussed herein yet. Thus, two embodiments are provided hereinafter for demonstrating the process of fabricating the chip according to the present application. In the two embodiments, thinned wafers 300 and 500 are respectively taken as an example, and the process of fabricating the chip is elaborated with reference to FIGS. 6A~6G and FIGS. 7A~7K.

Figure 6A:
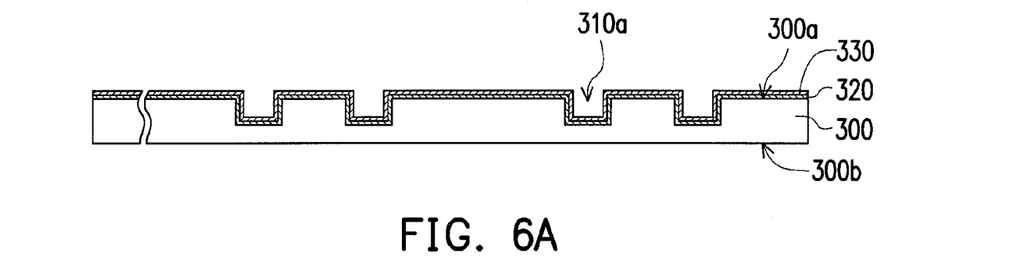
FIGS. 6A to 6G illustrate a process of fabricating a chip according to an embodiment of the present invention.
Figure 6B:
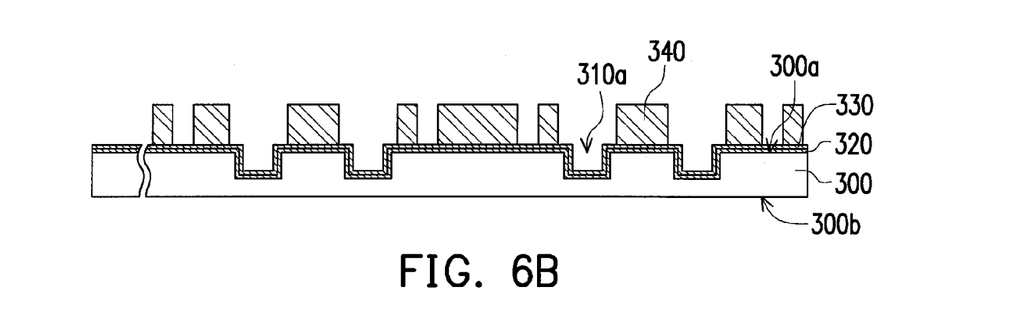
Figure 6C:
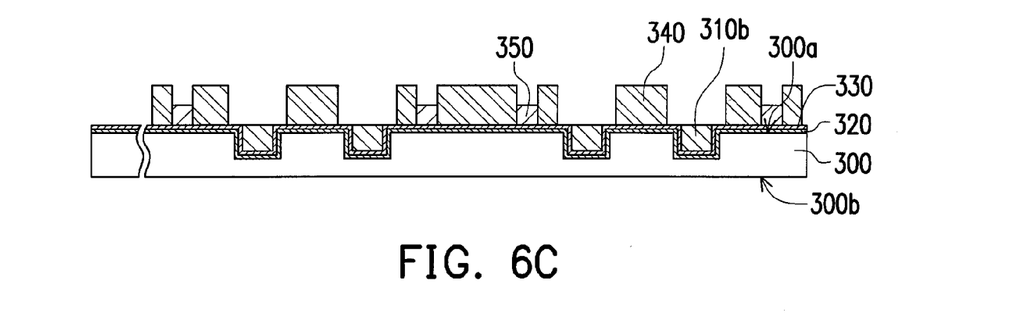
Figure 6D:
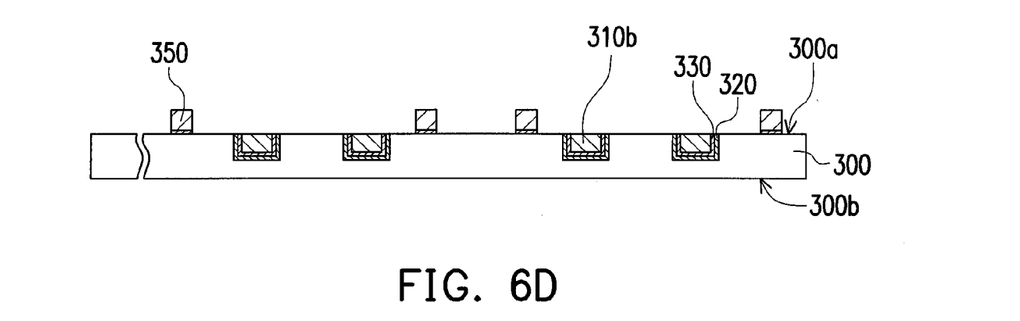

FIGS. 6A to 6G illustrate a process of fabricating a chip according to an embodiment of the present invention. To better facilitate descriptions of the invention, it should be mentioned that FIG. 6E contains a schematic top view and a schematic partially-enlarged view of the process of fabricating the chip as shown in FIG. 6D. Referring to FIG. 6A, in the process of fabricating the chip according to the present embodiment, a wafer 300 having a first surface 300a and a second surface 300b opposite to each other is provided at first.

Next, referring to FIG. 6A, a photolithography and anisotropic etching process is performed on the first surface 300a of the wafer 300 to form a plurality of holes 310a. Besides, an insulating layer 320 and an electroplating seed layer 330 covering the insulating layer 320 are formed on the first surface 300a and on walls of the holes 310a.

After that, referring to FIG. 6B, a patterned mask 340 is formed on the electroplating seed layer 330 located above the first surface 300a of the wafer 300. Here, the patterned mask 340 does not cover the holes 310a.

Referring to FIG. 6C, a conductive material is then formed in the holes 310a by performing an electroplating process on the electroplating seed layer 330, such that a plurality of conductive holes 310b are formed. Meanwhile, a plurality of stress buffer rings 350 are formed on a portion of the electroplating seed layer 330 located above the first surface 300a of the wafer 300. Here, the conductive holes 310b are respectively located in the stress buffer rings 350.

Figure 6E:
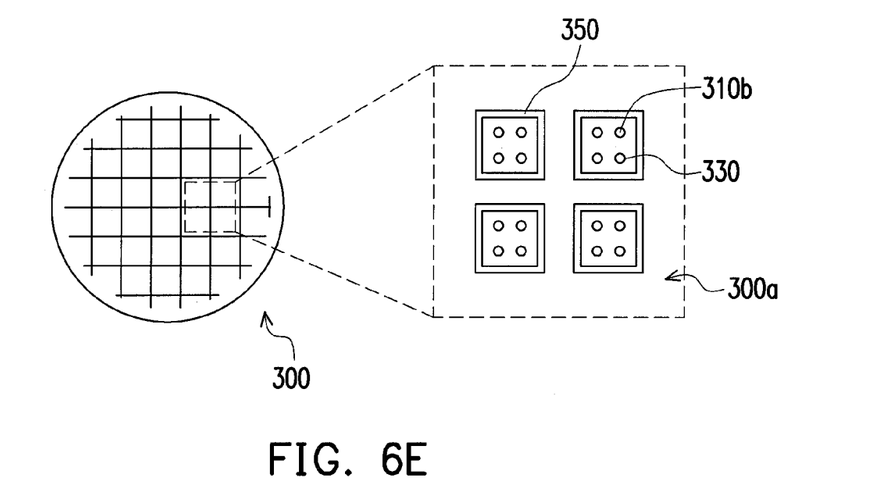

Thereafter, referring to FIGS. 6D and 6E, the patterned mask 340 and a portion of the electroplating seed layer 330 located below the patterned mask 340 are removed. So far, the conductive holes 310b and the stress buffer rings 350 protruding from the first surface 300a are completely formed on the wafer 300.

Figure 6F:
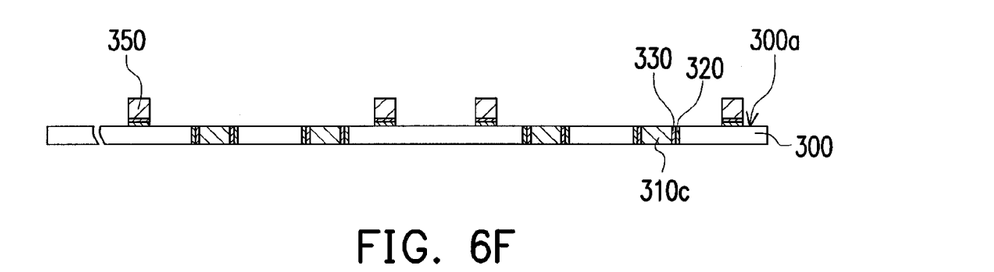
Figure 6G:
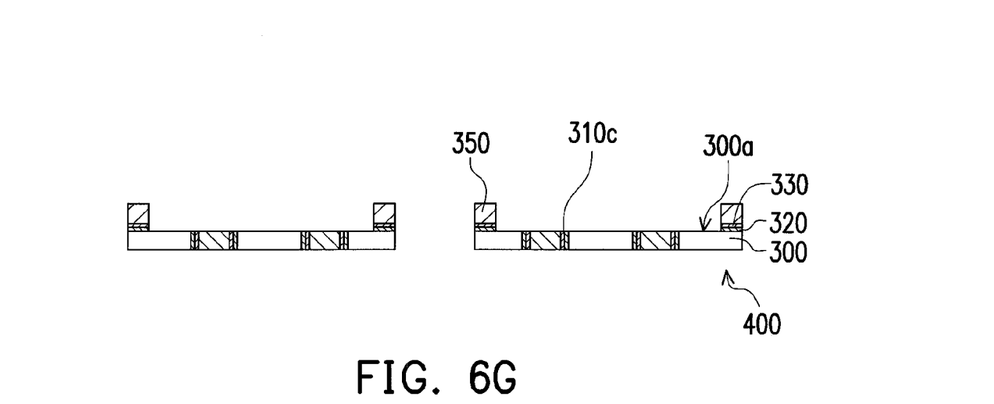

Next, referring to FIGS. 6F and 6G, a thinning process is performed on the second surface 300b of the wafer 300 until the conductive holes 310b are exposed, such that the conductive holes 310b are transformed into a plurality of conductive through holes 310c. Finally, the wafer 300 is cut along the stress buffer rings 350 to form a plurality of chip units 400.

Specifically, the stress buffer rings 350 are located on the first surface 300a of the wafer 300 in the present embodiment. Therefore, when the thinning process is performed on the wafer 300 to reduce the entire thickness of the wafer 300, the stress buffer rings 350 can serve as supporting structures for preventing the thinned wafer 300 from being cracked when the thinned wafer 300 is picked up, placed, and transported by a machine. Additionally, when the wafer 300 is cut along the stress buffer rings 350 and divided into a plurality of chip units 400, the stress buffer rings 350 can also preclude the wafer 300 from being cracked due to stress or preclude the cracks from extending to the adjacent chip units 400. Thereby, cutting yield can be improved.

In the present embodiment, note that the wafer 300 is a dummy wafer. Therefore, functions and types of the first surface 300a and the second surface 300b are substantially the same. However, in other embodiments not depicted in the drawings, given that the wafer is a device wafer having active devices, a surface of the wafer having the active circuits (including the active devices and interconnects) is an active surface, the conductive through holes connect the active circuits, and the stress buffer rings are located on an area outside the active circuits, which is still construed as a part of the technical proposal of the present application and does not depart from the protection range of the invention. Relative positions of the active circuits and the conductive through holes are similar to those of the active circuits 118 and the conductive through holes 130 illustrated in FIG. 5.

Particularly, when the stress buffer rings protruding from the surface of the wafer and the conductive through holes are completely formed on a wafer having the active devices, the wafer can be directly cut along the stress buffer rings to form a plurality of chip units having the active devices in no need of performing a thinning process.

In brief, according to the process of fabricating the chip in the present embodiment, the holes 310a are formed on the first surface 300a of the wafer 300 by implementing a photolithography and etching process. Thereafter, the stress buffer rings 350 protruding from the first surface 300a and the conductive holes 310b in the holes 310a are formed by performing an electroplating process and using the patterned mask 340. A thinning process is then performed on the wafer 300, and the wafer 300 is cut along the stress buffer rings 350 to form a plurality of chip units 400. That is to say, each of the chip units 400 of the present embodiment has the conductive through holes 310c and the stress buffer rings 350 protruding from the first surface 300a, and the stress buffer rings 350 can improve yield of cutting the wafer 300 during the process of fabricating the chip.

Figure 7A:
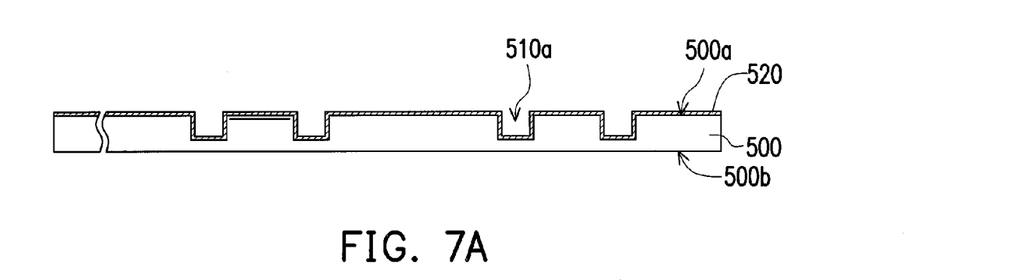
FIGS. 7A to 7K illustrate a process of fabricating a chip according to an embodiment of the present invention.
Figure 7B:
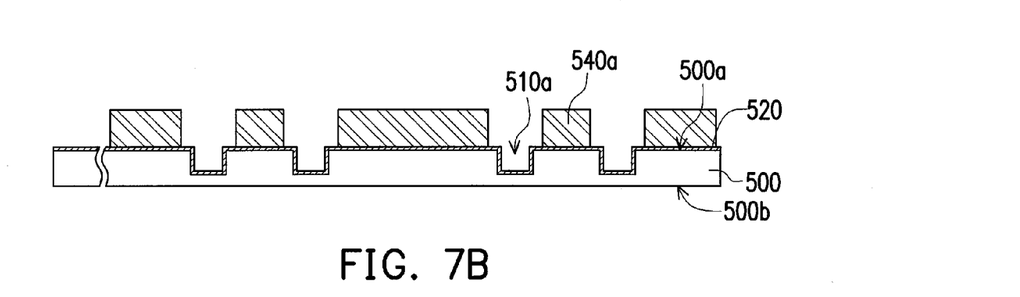
Figure 7C:
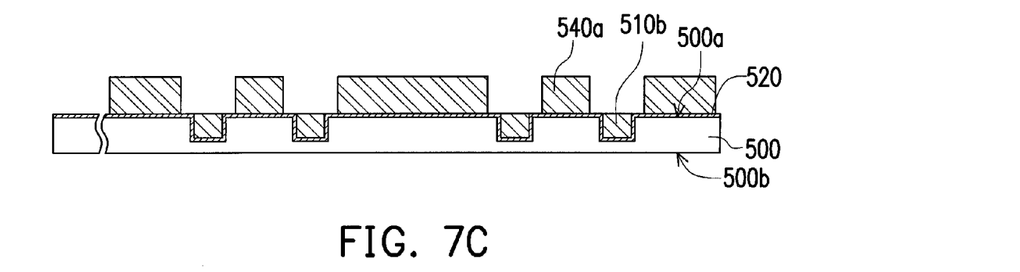
Figure 7D:
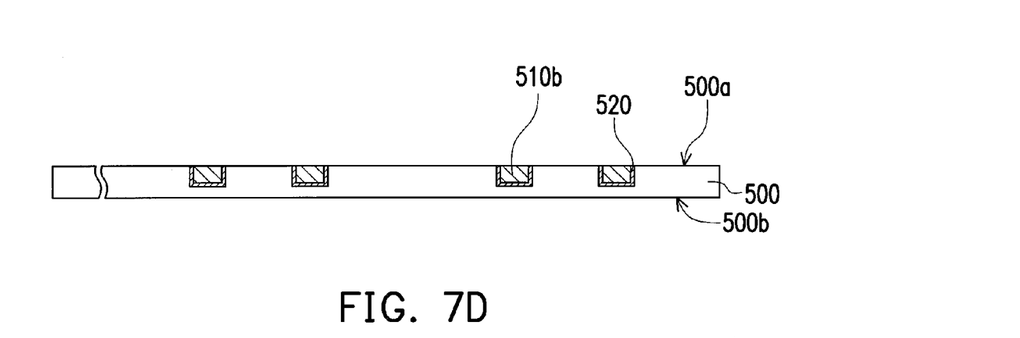
Figure 7E:
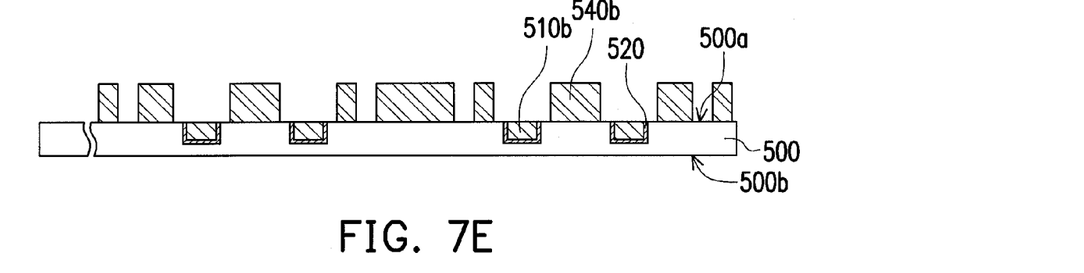
Figure 7F:
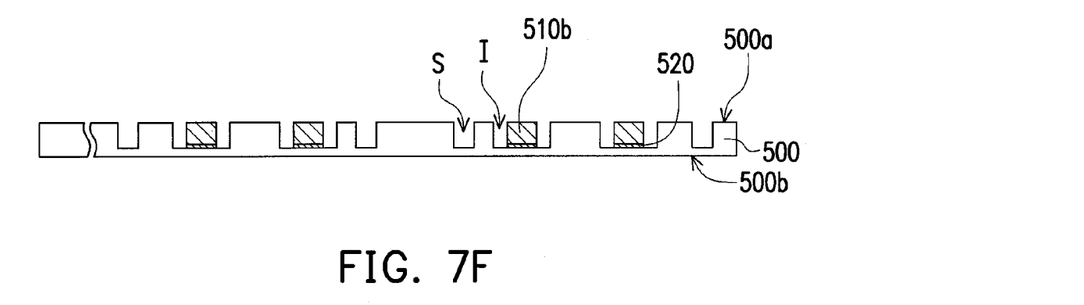
Figure 7G:
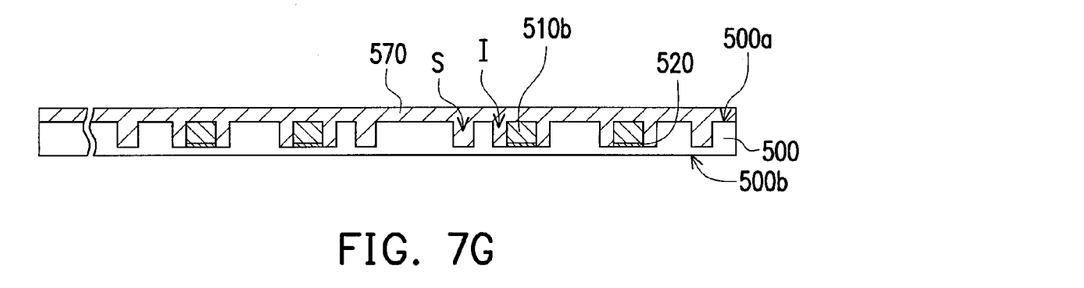
Figure 7H:
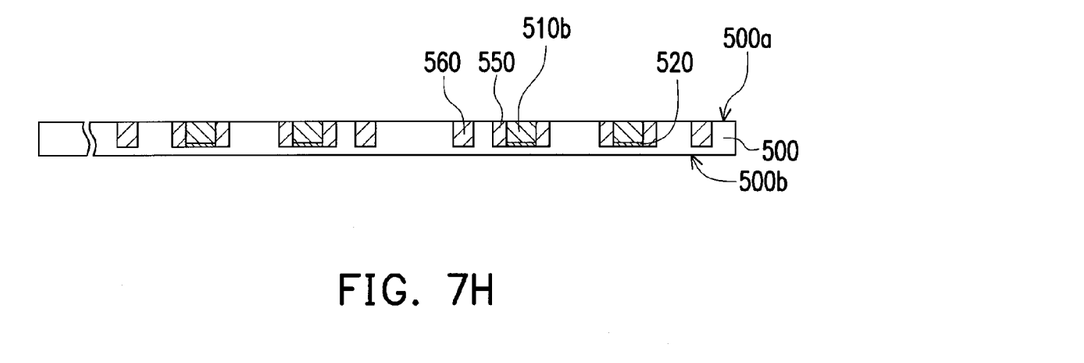
Figure 7I:
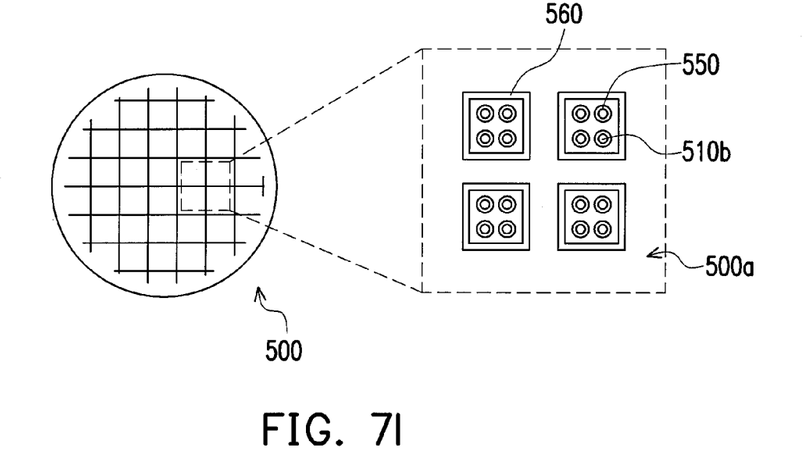

FIGS. 7A to 7K illustrate a process of fabricating a chip according to an embodiment of the present invention. To better facilitate descriptions of the invention, FIG. 7H contains a schematic top view and a schematic partially-enlarged view of the process of fabricating the chip as shown in FIG. 7I. Referring to FIG. 7A, according to the process of fabricating the chip in the present embodiment, a wafer 500 having a first surface 500a and a second surface 500b opposite to each other is provided at first.

Next, referring to FIG. 7A, a photolithography and anisotropic etching process is performed on the first surface 500a of the wafer 500 to form a plurality of holes 510a. Besides, an electroplating seed layer 520 is formed on the first surface 500a and on walls of the holes 510a.

After that, referring to FIG. 7B, a first patterned mask 540a is formed on the electroplating seed layer 520 located above the first surface 500a of the wafer 500. Here, the first patterned mask 540a does not cover the holes 510a.

Thereafter, referring to FIG. 7C, a conductive material is formed in the holes 510a by performing an electroplating process on the electroplating seed layer 520, such that a plurality of conductive holes 510b are formed.

As shown in FIG. 7D, the first patterned mask 540a and a portion of the electroplating seed layer 520 located below the first patterned mask 540a are then removed to expose the first surface 500a of the wafer 500 and partial surfaces of the holes 510b.

Next, referring to FIG. 7E, a second patterned mask 540b is formed on the first surface 500a of the wafer 500. Here, the second patterned mask 540b does not cover the holes 510b.

As indicated in FIG. 7F, the first surface 500a is then etched by using the second patterned mask 540b as an etching mask to form a plurality of insulating ring areas I and a plurality of stress buffer ring areas S. Here, the insulating ring areas I respectively expose side walls of the conductive holes 510b, and the insulating ring areas I are respectively located in the stress buffer ring areas S. After that, the second patterned mask 540b is removed.

Thereafter, referring to FIG. 7G, an insulating material 570 is disposed in the insulating ring areas I and the stress buffer ring areas S. In the present embodiment, the insulating material 570 is, for example, glass or polymer.

Next, referring to FIGS. 7H and 7I, a portion of the insulating material 570 is removed, such that the insulating material 570 is substantially flush with the first surface 500a of the wafer 500, and that a plurality of insulating rings 550 and a plurality of stress buffer rings 560 are formed. So far, the stress buffer rings 560 embedded in the first surface 500a and the conductive holes 510b are completely formed on the wafer 500.

Figure 7J:
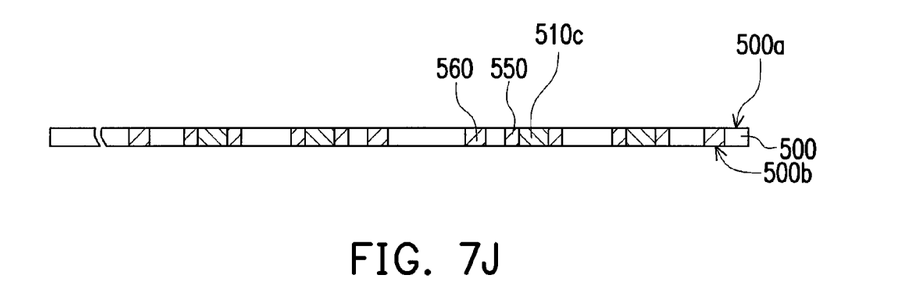
Figure 7K:
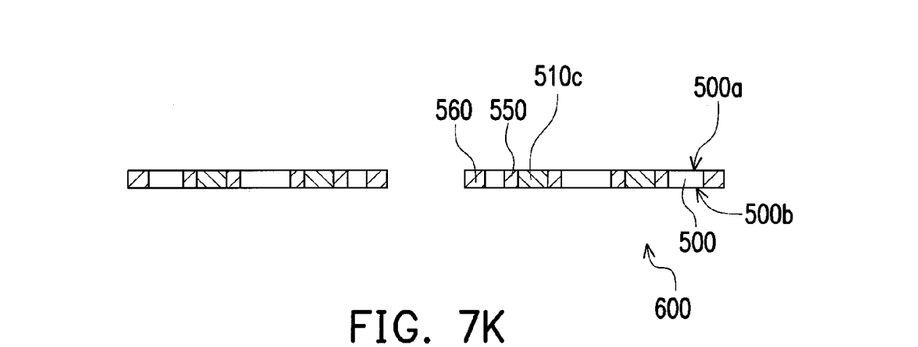

Afterwards, referring to FIGS. 7J and 7K, a thinning process is performed on the second surface 500b of the wafer 500 until the conductive holes 510b are exposed, such that the conductive holes 510b are transformed into a plurality of conductive through holes 510c. Finally, the wafer 500 is cut along the stress buffer rings 560 to form a plurality of chip units 600.

Specifically, the stress buffer rings 560 are embedded in the first surface 500a of the wafer 500 according to the present embodiment. Therefore, when the thinning process is performed on the wafer 500 to reduce the entire thickness of the wafer 500, the stress buffer rings 560 can serve as supporting structures for preventing the thinned wafer 500 from being cracked when the thinned wafer 500 is picked up, placed, and transported by a machine. Additionally, when the wafer 500 is cut along the stress buffer rings 560 and divided into a plurality of chip units 600, the stress buffer rings 560 can also preclude the wafer 500 from being cracked due to stress or preclude the cracks from extending to the adjacent chip units 600. Thereby, cutting yield can be improved.

In the present embodiment, note that the wafer 500 is a dummy wafer. Therefore, functions and types of the first surface 500a and the second surface 500b are substantially the same. However, in other embodiments not depicted in the drawings, given that the wafer is a device wafer having active devices, a surface of the wafer having the active circuits (including the active devices and interconnects) is an active surface, the conductive through holes connect the active circuits, and the stress buffer rings are located on an area outside the active circuits, which is still construed as a part of the technical proposal of the present application and does not depart from the protection range of the invention. Relative positions of the active circuits and the conductive through holes are similar to those of the active circuits 118 and the conductive through holes 130 illustrated in FIG. 5.

In particular, when the stress buffer rings embedded in the surface of the wafer and the conductive through holes are completely formed on a wafer having the active devices, the wafer can be directly cut along the stress buffer rings to form a plurality of chip units having the active devices in no need of performing a thinning process.

In brief, according to the process of fabricating the chip in the present embodiment, the holes 510a, the insulating ring areas I, and the stress buffer ring areas S are formed on the first surface 500a of the wafer 500 by implementing two photolithography and etching processes, respectively. In the meantime, the conductive holes 510b are formed in the holes 510a by performing an electroplating process and using the first patterned mask 540a. After that, the insulating material 570 is disposed in the insulating ring areas I and the stress buffer ring areas S to form the insulating rings 550 and the stress buffer rings 560. Finally, a thinning process is performed on the wafer 500, and the wafer 500 is cut along the stress buffer rings 560 to form a plurality of chip units 600. That is to say, each of the chip units 600 of the present embodiment has the conductive through holes 510c and the stress buffer rings 560 embedded in the first surface 500a, and the stress buffer rings 560 can improve yield of cutting the wafer 600 during the process of fabricating the chip.

In light of the foregoing, the wafer structure of the present application is equipped with a stress buffer layer. Therefore, after a thinning process is carried out, the stress buffer layer not only can serve as a supporting structure for preventing the thinned wafer structure from being cracked when the thinned wafer structure is picked up, placed, and transported by a machine, but also can preclude the wafer from being cracked or preclude the cracks from extending to the chip areas located at respective sides of adjacent cutting paths when the wafer structure is cut and divided into a plurality of chip structures. As such, the cutting yield can be improved.

Moreover, in the process of fabricating the chip of the present application, the stress buffer rings protruding from or embedded in a surface of the wafer are formed. Hence, when the wafer is cut along the stress buffer rings to form a plurality of chip units, the stress buffer rings are capable of preventing the wafer from being cracked due to stress and precluding the cracks from extending to the adjacent chip units. As a result, the cutting yield can be improved. In conclusion, manufacturing yield can be achieved by performing the process of fabricating the chip according to the present application.

Although the present application has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A process of fabricating a chip, the process comprising:
   providing a wafer having a first surface and a second surface opposite to each other;
   forming a plurality of holes on the first surface of the wafer;
   forming an electroplating seed layer on the first surface and on walls of the holes;
   forming a first patterned mask on the electroplating seed layer located above the first surface;
   forming a conductive material in the holes by performing an electroplating process so as to form a plurality of conductive holes;
   removing the first patterned mask and a portion of the electroplating seed layer located below the first patterned mask;
   forming a second patterned mask on the first surface of the wafer;
   etching the first surface with use of the second patterned mask as an etching mask so as to form a plurality of insulating ring areas and a plurality of stress buffer ring areas, wherein the insulating ring areas respectively expose side walls of the conductive holes, and the insulating ring areas are respectively located in the stress buffer ring areas; and
   disposing an insulating material in the insulating ring areas and the stress buffer ring areas to form a plurality of insulating rings and a plurality of stress buffer rings.

2. The process of fabricating the chip as claimed claim 1, further comprising removing the second patterned mask before the insulating material is disposed in the insulating ring areas and the stress buffer ring areas.

3. The process of fabricating the chip as claimed claim 1, after the insulating ring areas and the stress buffer ring areas are formed, further comprising:
   performing a thinning process on the second surface of the wafer until the conductive holes are exposed, such that the conductive holes are transformed into a plurality of conductive through holes; and
   cutting the wafer along the stress buffer rings to form a plurality of chip units.

4. The process of fabricating the chip as claimed in claim 1, wherein a plurality of active circuits is formed on the second surface of the wafer, and the holes penetrate the first surface and connect the active circuits.

5. The process of fabricating the chip as claimed claim 4, after the insulating ring areas and the stress buffer ring areas are formed, further comprising:

cutting the wafer along the stress buffer rings to form a plurality of chip units.

6. The process of fabricating the chip as claimed claim 1, wherein a method of forming the holes comprises a photolithography and anisotropic etching process.

7. The process of fabricating the chip as claimed claim 1, wherein the first patterned mask does not cover the holes.

8. The process of fabricating the chip as claimed claim 1, wherein the second patterned mask does not cover the holes.

9. The process of fabricating the chip as claimed claim 1, wherein the insulating material comprises glass or polymer.

10. The process of fabricating the chip as claimed claim 1, wherein the insulating material is substantially flush with the first surface of the wafer.

11. The process of fabricating the chip as claimed claim 1, wherein the wafer comprises a dummy wafer or a device wafer having active devices.

12. The process of fabricating the chip as claimed claim 3, wherein the stress buffer rings serves as supporting structures for supporting the thinned wafer.

13. The process of fabricating the chip as claimed claim 4, wherein the stress buffer rings are located on an area outside the active circuits.

14. The process of fabricating the chip as claimed claim 4, wherein the active circuits comprises active devices and interconnects.

15. The process of fabricating the chip as claimed claim 3, wherein each of the chip units has the conductive through holes and the stress buffer rings embedded in the first surface.

16. The process of fabricating the chip as claimed claim 1, wherein the first surface of the wafer and partial surface of the conductive holes are exposed after removing the first patterned mask and the portion of the electroplating seed layer located below the first patterned mask and before forming the second patterned mask on the first surface of the wafer.

* * * * *